(12) United States Patent
Truthseeker et al.

(10) Patent No.: US 8,946,542 B1
(45) Date of Patent: Feb. 3, 2015

(54) SOLAR MODULE BONDING METHOD INTEGRATED INTO A PAN STRUCTURE

(75) Inventors: Samuel Truthseeker, El Sobrante, CA (US); Charles Wade Albritton, Hercules, CA (US); Ramachandran Narayanamurthy, El Cerrito, CA (US); Joshua Reed Plaisted, Oakland, CA (US)

(73) Assignee: SunEdison, Inc., Maryland Heights, MO (US)

( * ) Notice: Subject to any disclaimer, the term of this patent is extended or adjusted under 35 U.S.C. 154(b) by 314 days.

(21) Appl. No.: 13/531,779

(22) Filed: Jun. 25, 2012

Related U.S. Application Data

(60) Provisional application No. 61/501,090, filed on Jun. 24, 2011.

(51) Int. Cl.
  *H01L 31/042* (2014.01)
  *H01L 31/18* (2006.01)
(52) U.S. Cl.
  CPC ............ *H01L 31/0424* (2013.01); *H01L 31/18* (2013.01)
  USPC .......................................... 136/251; 136/244
(58) Field of Classification Search
  USPC ............................................... 136/251, 244
  See application file for complete search history.

(56) References Cited

U.S. PATENT DOCUMENTS

| | | | | |
|---|---|---|---|---|
| 4,040,867 | A | * | 8/1977 | Forestieri et al. ............. 136/244 |
| 4,104,083 | A | * | 8/1978 | Hirano .......................... 136/259 |
| 4,239,555 | A | * | 12/1980 | Scharlack et al. ............ 136/251 |
| 4,677,248 | A | * | 6/1987 | Lacey ............................ 136/244 |
| 4,860,509 | A | * | 8/1989 | Laaly et al. ................... 52/173.3 |
| 5,112,408 | A | * | 5/1992 | Melchior ....................... 136/251 |
| 5,289,999 | A | * | 3/1994 | Naujeck et al. ............. 244/172.7 |
| 5,590,495 | A | * | 1/1997 | Bressler et al. .............. 52/173.3 |
| 5,830,779 | A | * | 11/1998 | Bressler et al. ................. 438/65 |
| 2007/0157963 | A1 | * | 7/2007 | Metten et al. ................. 136/251 |
| 2008/0053517 | A1 | * | 3/2008 | Plaisted et al. ................ 136/251 |
| 2009/0019796 | A1 | * | 1/2009 | Liebendorfer ............... 52/173.3 |
| 2009/0320908 | A1 | * | 12/2009 | Botkin et al. ................. 136/251 |

* cited by examiner

*Primary Examiner* — Golam Mowla
(74) *Attorney, Agent, or Firm* — Armstrong Teasdale LLP

(57) ABSTRACT

A pan structure for bonding solar modules installed on a target position is provided. The pan structure includes a plate member configured to be disposed across a spacing between two rail structures for mounting one or more solar modules. Additionally, the pan structure includes a pair of edge members configured to couple the plate member respectively with the two rail structures. Each of the pair of edge members has a first ledge characterized to be electrically conductive and configured to be supported by one of the two rail structures and a second ledge connected the first ledge to the plate member to keep the plate member a distance below the first ledge. Moreover, the pan structure includes a plurality of contact elements spatially distributed along the first ledge for bonding both the one or more solar modules and the rail structures for electric grounding.

20 Claims, 11 Drawing Sheets

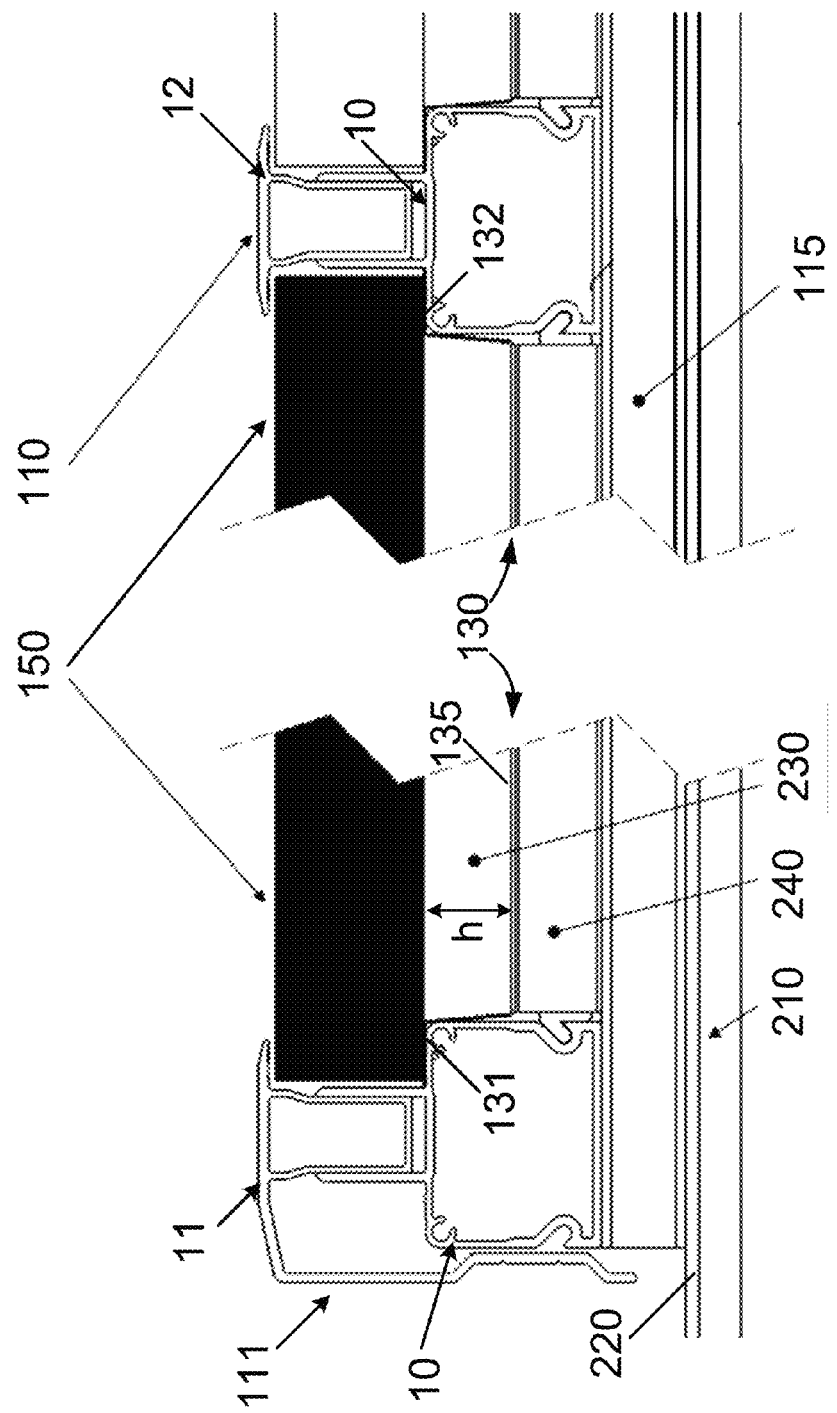

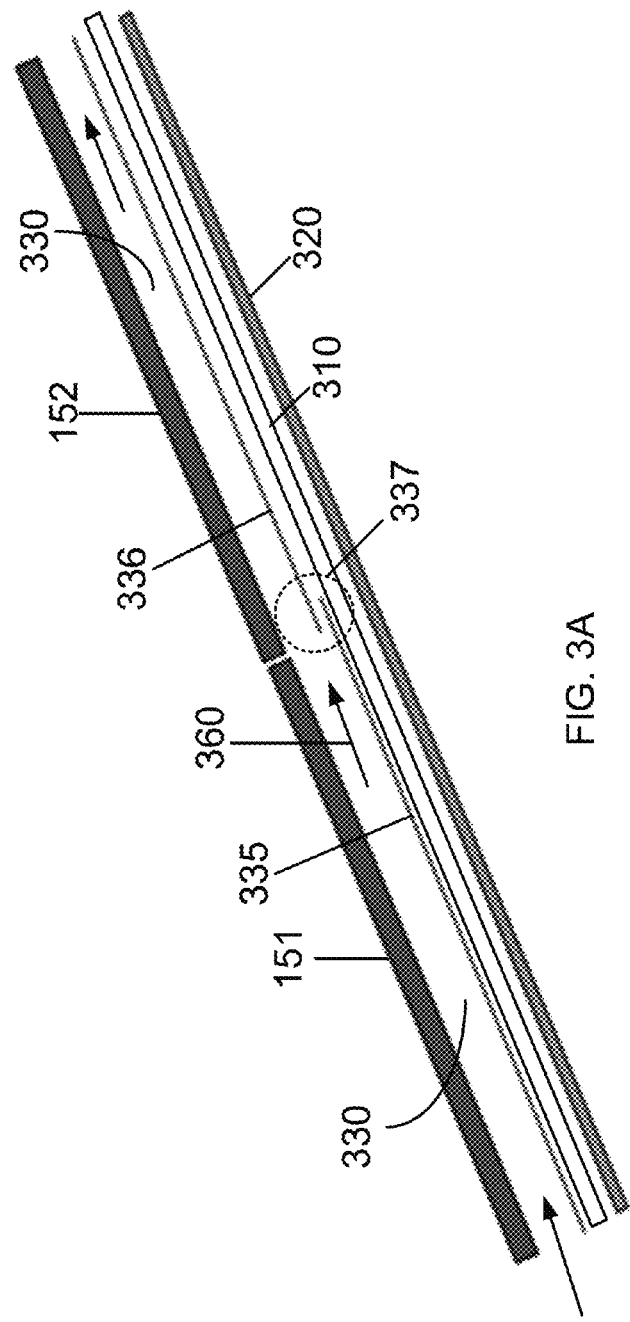
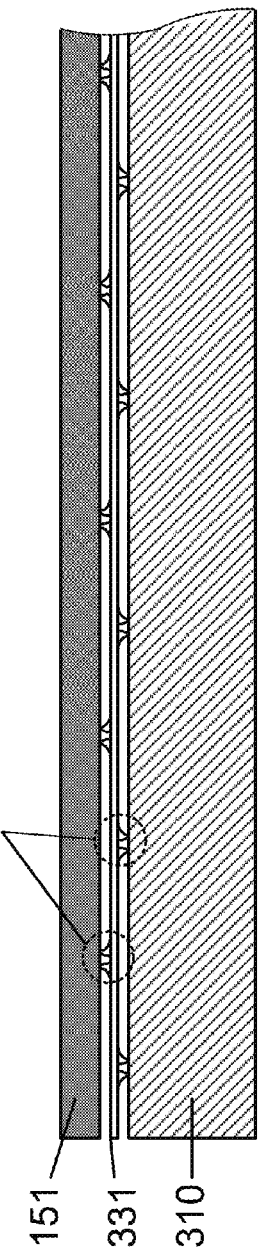
FIG. 3A
FIG. 3B

SOLAR MODULE BONDING METHOD INTEGRATED INTO A PAN STRUCTURE

CROSS-REFERENCES TO RELATED APPLICATIONS

This application claims priority to U.S. Provisional Patent Application No. 61/501,090, filed Jun. 24, 2011, entitled "SOLAR MODULE BONDING METHOD INTEGRATED INTO A PAN STRUCTURE" filed by Samuel Truthseeker, et al., commonly assigned and incorporated by reference herein for all purposes.

BACKGROUND OF THE INVENTION

The present invention relates to solar module installation application. More particularly, the present invention provides a solar module bonding method integrated into a pan structure for providing automatic bonding of multiple solar modules for electrical grounding. Merely, by way of example, the present invention has been applied to solar module roof top installation for utilizing both electric power and thermal power generated by the solar module for any homes, but it would be recognized that the invention has a much broader range of applications.

Over the past centuries, the world population of human beings has exploded. Along with the population, demand for resources has also grown explosively. Such resources include raw materials such as wood, iron, and copper and energy, such as fossil fuels, including coal and oil. Industrial countries worldwide project more increases in oil consumption for transportation and heating purposes from developing nations such as China and India. Obviously, our daily lives depend, for the most part, upon oil or other forms of fossil fuel, which are becoming scarce as it becomes depleted.

Along with the depletion of our fossil fuel resources, our planet has experienced a global warming phenomena, known as "global warming," and brought to our foremost attention by our former Vice President Al Gore. Global warming is known as an increase in an average temperature of the Earth's air near its surface, which is projected to continue at a rapid pace. Warming is believed to be caused by greenhouse cases, which are derived, in part, from use of fossil fuels. The increase in temperature is expected to cause extreme weather conditions and a drastic size reduction of the polar ice caps, which in turn will lead to higher sea levels and an increase in the rate of warming. Ultimately, other effects include mass species extinctions, and possibly other uncertainties that may be detrimental to human beings.

Much if not all of the useful energy found on the Earth comes from our sun. Generally all common plant life on the Earth achieves life using photosynthesis processes from sun light. Fossil fuels such as oil were also developed from biological materials derived from energy associated with the sun. For life on the planet Earth, the sun has been our most important energy source and fuel for modern day solar energy. Solar energy possesses many characteristics that are very desirable! Solar energy is renewable, clean, abundant, and often widespread. Accordingly, solar panels have been developed to convert sunlight into energy. Most solar energy systems today use "PV" technology. They convert sunlight directly into the electricity that you use to light your home, or power your appliances. As merely another example, solar thermal panels also are developed to convert electromagnetic radiation from the sun into thermal energy for heating homes, running certain industrial processes, or driving high grade turbines to generate electricity. In fact, solar photovoltaic panels also generate heat as a side product. Solar panels are generally composed of an array of solar (PV and/or thermal) cells, which are interconnected to each other. The cells are often arranged in series and/or parallel groups of cells in series. Accordingly, solar panels have great potential to benefit our nation, security, and human users. They can even diversify our energy requirements and reduce the world's dependence on oil and other potentially detrimental sources of energy.

Although solar panels have been used successful for certain applications, there are still certain limitations. Solar cells are often costly. Depending upon the geographic region, there are often financial subsidies from governmental entities for purchasing solar panels, which often cannot compete with the direct purchase of electricity from public power companies. Additionally, most PV solar energy systems only utilize about 15% of the captured sun's energy. The remaining energy, mostly in the form of heat or thermal energy, remains untapped. Moreover, conventional solar energy systems are also difficult to maintain and monitor for operational accuracy. Once a solar energy system has been installed, there is simply no easy way to monitor the accuracy of energy production. In particular, a solar module can include multiple PV solar panels integrated with one or more solar thermal panels for being installed on roof top of a target home to couple with other traditional building utility modules for providing electricity supply, hot water supply, home heating, cooling, and ventilation. There is need of simple-to-manufacture, easy-to-use structural parts bearing multi-functions for installing the solar module while providing automatic electric bonding of multiple panels and efficiently utilizing thermal energy carried from the module. These and other limitations are described throughout the present specification, and may be described in more detail below.

From the above, it is seen that improved techniques for mounting and bonding integrated solar module are highly desired.

BRIEF SUMMARY OF THE INVENTION

The present invention relates to solar module installation application. More particularly, the present invention provides a solar module bonding method integrated into a pan structure for providing automatic bonding of multiple solar modules for electrical grounding. Merely, by way of example, the present invention has been applied to solar module roof top installation for utilizing both electric power and thermal power generated by the solar module for any homes, but it would be recognized that the invention has a much broader range of applications.

In a specific embodiment, the present invention provides a pan structure for bonding solar modules installed on a target position. The pan structure includes a plate member having a length and a width. The plate member is configured to have the width to fit a spacing between two rail structures. The pan structure further includes a pair of edge members configured to respectively attach to two length sides of the plate member. Each of the pair of edge members has a first ledge and a second ledge. The first ledge is electrically conductive and has a bottom side being supported by one of the two rail structures and a top side for supporting at least a frame edge region of a solar module. The second ledge connects the first ledge to the length side of the plate member to provide a distance between the bottom side of the first ledge and the plate member. Furthermore, the pan structure includes a plurality of contact elements spatially distributed along the first ledge. Each contact element comprises one or more protrusions on both the top side and the bottom side of the first ledge for generating a bonding force between the frame edge region of the solar module mounted on the first ledge and the rail structures.

In an alternative embodiment, a solar module bonding method integrated into a pan structure is provided. The method includes disposing at least two rail structures with a lateral spacing on a target location and installing a pan structure comprising a plate member and a pair of edge members. The pair of edge members is configured to respectively couple the two rail structures with the plate member across the lateral spacing. The method further includes introducing a plurality of contact elements distributed in each of the pair of edge members at alternative locations. Each contact element includes upward-pointed tips and downward-pointed tips. The method further includes disposing a solar module packaged in a frame structure so that the pair of edge members is sandwiched between the frame structure and the two rail structures. Furthermore, the method includes fastening the solar module on the two rail structures so that the upward-pointed tips are compressed partially into the frame structure of the solar module and downward-pointed tips are compressed partially into the rail structure. The plurality of contact elements in each of the pair of edge members form electrical grounding pathways for the solar module without extra wiring. The plate member automatically forms a barrier of thermal insulation and fire retardation for the target location.

In yet another alternative embodiment, the present invention provides A pan structure for bonding solar modules supported at least by four stanchions on a target position, the pan structure includes a plate member substantially matching a dimension of a solar module and a pair of edge members configured to couple the plate member with the at least four stanchions. Each of the pair of edge members has a first ledge member being electrically coupled with two of the four stanchions and a second ledge member connecting the first ledge member to a length side of the plate member with an angled configuration so that the plate member is located a distance below the first ledge member. The pan structure further includes one or more contact elements at least distributed along first ledge member for bonding the solar module for electrical grounding. The plate member in this embodiment is configured to be a fire barrier for isolating the solar module from the target position and a base plane of a plenum structure within the distance provided between the solar module and the plate member.

Many benefits can be achieved by ways of the embodiments according to the present invention. The electrical bonding function is simply built in a pan structure that serves multi-functional structure parts for installing the solar module on a target location. For example, the pan structure includes a plurality of contact elements on an edge member to have its one side bonded at multiple locations with metal frame portions of the solar panels and another side bonded with a rail structure to form a complete electric path for electric grounding of the solar modules disposed on the target location. This solar module bonding method replaces conventional unreliable wired grounding for each solar panel and simplifies the installation procedures with labor cost saving. Additionally, the pan structure also uses a plate member connected to the edge member to serve as a fire barrier for the underlayment material of the target location. The same pan structure combined with the disposed solar module creates a plenum structure by a spatial volume between a bottom face of the solar module and the plate member. The plenum structure helps to draw air flowing through the bottom face of the solar module to carry thermal energy generated by the solar module for home utility applications. Depending on the embodiment, one or more of these benefits may be achieved. These and other benefits will be described in more detailed throughout the present specification and particularly below.

BRIEF DESCRIPTION OF THE DRAWINGS

FIGS. 2A and 2B are enlarged sectional view illustrating two rail structures for mounting solar modules with pan structures according to an embodiment of the present invention.

FIG. 3A is a simplified cross-sectional view of installed solar modules and pan structures along AA line in FIG. 1 in a partial disassembled state according to an embodiment of the present invention.

FIG. 3B is a simplified cross-sectional view of a solar module bonded by a plurality of contact elements in a pan structure along BB line in FIG. 1 according to an embodiment of the present invention.

FIG. 5A is a detailed side view of a marked end region in FIG. 5 according to the embodiment of the present invention.

FIGS. 6A and 6B are detailed side views of respective marked end regions in FIG. 6 according to the embodiment of the present invention.

DETAILED DESCRIPTION OF THE INVENTION

According to embodiments of the present invention, a method and a structure for forming a photovoltaic cell is provided. More particularly, the present invention provides a method and structure for forming a thin film photovoltaic cell. Merely by way of example, embodiments according to the present invention have been implemented to form hazy zinc oxide thin film over shaped solar cells. But it would be recognized that embodiments according to the present invention can have a much broader range of applicability.

Figure 1:
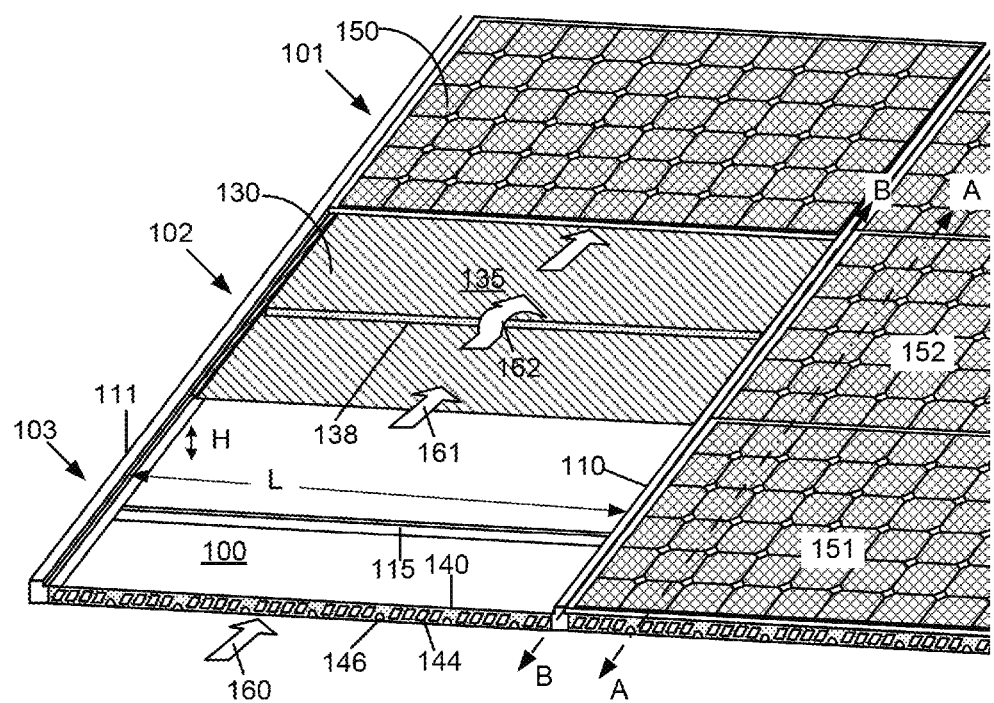
FIG. 1 is a simplified diagram illustrating a pan structure associated with one or more solar modules mounted on two rail structures disposed on a target location according to an embodiment of the present invention.

FIG. 1 is a simplified diagram illustrating a pan structure associated with one or more solar modules mounted on two rail structures disposed on a target location according to an embodiment of the present invention. This diagram is merely an example and should not unduly limit the claims herein. One skilled in the art would recognize other variations, modifications, and alternatives. In a specific embodiment, the target location is a roof of a home selected for installing one or more solar modules 150. As shown, the roof is exposed with an underlayment material 100 on which one or more struts 115 can be directed laid out. Over the struts at least two rail structures 111 and 110 are disposed. In an embodiment, the two or more rail structures are laid in parallel with a lateral spacing L between each other along the slope of the roof. The rail structures are configured for mounting one or more solar modules in the target home location. A first type of rail structure 111 is to support a group of installed solar modules from one common side edge and a second type of rail structure 110 is to support both left and right neighboring solar modules. The first type of rail structure 111 has a substantially the same base member as the second type of rail structure 110 but has a different cap member. At the lowest end of the trail structures, an end plate 140 is optionally added. The end plate includes a plurality of through-holes 144 and 146 allowing air to pass through and draining rain water properly. The solar module 150, in an embodiment, is a framed panel made by solar devices selected by photovoltaic (PV) devices, solar thermal devices, and a combination of both the PV devices and solar thermal devices. The frame structure of the solar module typically is made by aluminum for its easily manufacturability and relative low cost. The aluminum frame also is anodized for electric protection. The solar thermal devices are made for converting sun power into thermal energy and the PV devices not only convert sun power into electrical power but also generate thermal energy. All the electrical and thermal power generated by the solar module 150 are utilized in various ways, as illustrated in U.S. patent application Ser. No. 12/684,788, U.S. patent application Ser. No. 12/690,649, and U.S. patent application Ser. No. 12/952,095, commonly assigned to PVT Solar Inc. and incorporated as references for all purposes.

In a specific embodiment, the one or more solar modules 150 are mounted one after another from the lowest end and up along the rail structures. The rail structures 111 and 110 have a certain height H allowing one or more pan structures 130 to be installed between the one or more solar modules and the underlayment material 100. As shown, between the two rail structures 111 and 110 three regions are respectively illustrated with a first region 101 including a solar module 150 in its installed position, a second region 102 including only a pan structure 130 with a solar module being removed, and a third region 103 with both a solar module and a pan structure removed. Although not necessary, the pan structure 130 has a substantially similar size of the solar module 150 and is installed one by one separately onto the rail structures. In a specific embodiment, the pan structure 130 includes a flat region 135 coupled with at least two edge regions respectively configured to be supported by the rail structures 111 and 110. In another specific embodiment, the pan structure 130 is made by a sheet metal. The flat region 135 may be added with one or more structure elements 138 therein for strengthening the pan structure itself or serving for other purposes. Of course, there are many variations, alternatives, and modifications. More details about the structures of the edge region and the structure elements on the flat region can be seen in following sections of the specification.

In one or more embodiments, the configuration of the inserted pan structures 130 and the installed solar modules 150 on two mounting rail structures leads to a formation of a plenum structure to draw airflows 160 from ambient through the holes 144 in the end plate 140. Further the airflow 161 flows through the space between the solar modules and the pan structures 130. Furthermore, the airflow 162 continues to flow with induced turbulence by any structure elements 138 added on the flat region 135. The airflow 163 is heated along its way by the thermal energy generated by the solar modules 150 and can be utilized as an energy medium for many home utility applications.

FIGS. 2A and 2B are enlarged sectional view illustrating two rail structures for mounting solar modules with pan structures according to an embodiment of the present invention. These diagrams are merely examples and should not unduly limit the claims herein. One skilled in the art would recognize other variations, modifications, and alternatives. As shown in FIGS. 2A and 2B, one edge of the solar module 150 is mounted on a first type rail structure 111 and another edge is mounted on a second type rail structure 110. Both the first type rail structure 111 and the second type rail structure has a substantially the same base member 10 having two shoulder regions for supporting a frame edge region of a solar module and a middle region for clamping a cap member. The first type rail structure 111 has a cap member 11 having a curved portion on one side for guiding rain water flow and a flat portion on opposite side for clamping a solar module. The second type rail structure 110 has a cab member 12 having flat portions on both sides respectively for clamping a solar module to the left and another solar module to the right. Before loading the solar module frame, an edge member 131 of a pan structure 130 is inserted first to the shoulder region of the base member 10 of the rail structure 111 and the opposite edge member 132 is inserted to the shoulder region of the base member 10 of the second rail structure 110. The edge member 131 or 132 is a Γ-shaped structure with a first ledge being supported by the shoulder region of the base member 10 of the rail structure 111 or 110 (and below the frame structure of the solar module 150) and a second ledge connected the first ledge to the flat region 135 of the pan structure 130 in an angle such that the flat region 135 is located a distance (or height) h below the first ledge (or the shoulder region of the base member). The distance h allows a volume of space 230 between the bottom of the solar module 150 and the flat region 135. The volume of space 230 can be just an air gap or extra spacing for certain structure elements added on the flat region 135.

Both FIGS. 2A and 2B also show that the two rail structures 111 and 110 are supported by a strut 115 which is mounted directly on a roof deck 210 through an exposed underlayment material 220. In a specific embodiment, the pan structure 130 provides a direct barrier between the solar module 150 and the exposed underlayment material 220. For example, the pan structure 130 can serve by itself as a barrier for the underlayment material in case the solar module is overheating, burning, or hitting by external fire debris. In another example, the pan structure 130 includes a bottom fixture 240 to allow an insulation form being added for providing additional fire protection and heat retardation for a cool roof. Of course, there can be other variations, alternatives, and modifications.

FIG. 3A is a simplified cross-sectional view of installed solar modules and pan structures along AA line in FIG. 1 in a partially disassembled state according to an embodiment of the present invention. This diagram is merely an example and should not unduly limit the claims herein. One skilled in the art would recognize other variations, modifications, and alternatives. As an example, two solar modules 151 and 152 are mounted next to each other and correspondingly two pan structures 335 and 336 are inserted below those two solar modules and above a rail structure 310 installed on an underlayment material 320 of a building roof. A gap region 330 exits between the bottom faces of the solar modules 151, 152 and the flat regions of the pan structures 335, 336 along the length direction (of the sloped roof). In an embodiment, the gap region 330 allows a formation of a plenum structure configured to be a pathway for airflow 360, as shown, flowing from lower end to higher end along the rail structure 310. Below the pan structures 335 and 336 an underlayment material 320 is still a distance away, allowing the pan structures to decouple the solar modules from the roof top as a barrier. On one hand, the pan structures serve as a thermal barrier to prevent potential hot airflow (carried heat out of the solar modules) from direct transferring thermal energy to the roof. The roof can be kept cool during operation of the solar modules to generate thermal energy. On the other hand, the pan structures serve as a fire barrier to protect the underlayment material 320. The pan structure can further be configured with one or more insulating or fire-retardant materials to enhance the functionality as a thermal or fire barrier.

In another specific embodiment, the pan structure 336 disposed at the higher position is set a portion of its flat region over another portion of the pan structure 335 disposed at the lower position. The overlapped portion 337 provide natural configuration for draining rain water in the pan structures attached with the rail structure disposed on the sloped roof (or simply sloped rail structures by themselves). In another embodiment, the overlapped portion 337 helps to form at least an electric connection between two conductive pan structures so that all pan structures can be in a common grounding base even if the rail structures are made by insulating materials.

FIG. 3B is a simplified cross-sectional view of a solar module bonded by a plurality of contact elements in a pan structure along BB line in FIG. 1 according to an embodiment of the present invention. This diagram is merely an example and should not unduly limit the claims herein. One skilled in the art would recognize other variations, modifications, and alternatives. As another example, the solar module 151 is set to have its frame disposed on top of an edge region 331 of a pan structure (335) which is supported by the rail structure 310 in this cross-sectional view. In an embodiment, the edge region 331 includes a plurality of contact elements 340 distributed along the length of the edge region. Part of the plurality of contact elements 340 have upward tips to bond with the frame structure of the solar module 151 and rest of the plurality of contact elements 340 have downward tips to bond with the rail structure 310.

In a specific embodiment, the frame structure of the solar module is made of anodized aluminum or a regular aluminum material coated with a paint, or some other coated or uncoated metal. In order to properly ground the frame structure the upward tips are intentionally sharpened so that they can penetrate the insulating oxide layers or the paint layers to reach the aluminum metal for forming an electric bonding. The downward tips then form electric bonding with the rail structures to make the rail structure a natural busbar conductor (assuming the rail structure is made by typical aluminum material). In an alternative embodiment, the overlapped region 327 of two pan structures includes at least one such contact element so that the pan structures form electric bonding between each other. Thus, even the rail structure is replaced by insulator or poor conductor, for example made by plastic material, the mutually bonded pan structures can act as the common grounding base for the solar module system. The pan structure or at least the edge region of the pan structure, in an embodiment, is a steel sheet metal coated with aluminized zinc coating or simply a paint for reducing corrosion for outdoor application, especially at the contact tip region. In another specific embodiment, the plurality of contact elements include a large number of upward or downward tips along the long length of the edge region so that the bonding at multiple locations is formed to secure the electric grounding of the large sized solar panel.

Figure 3C:
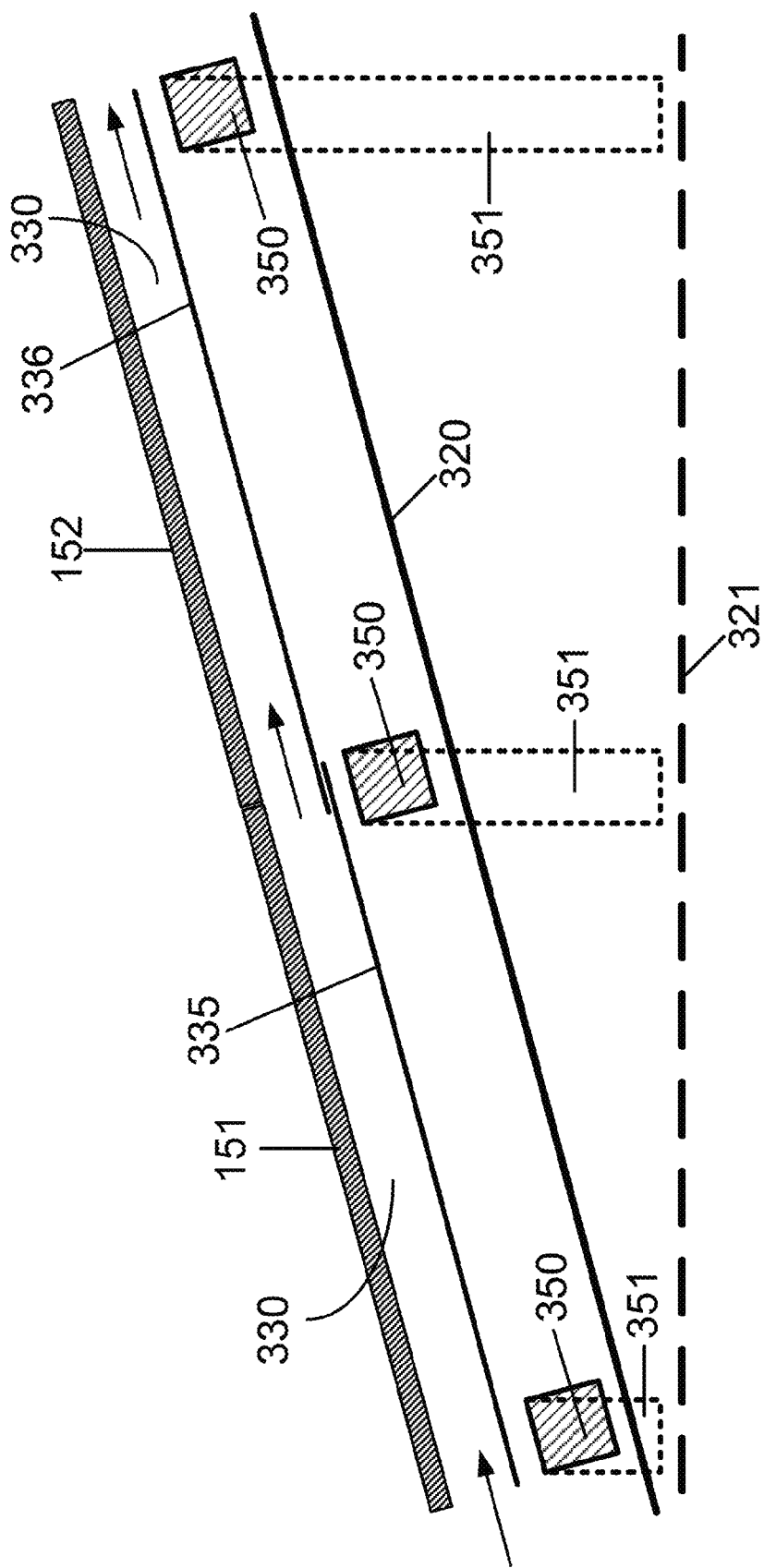
FIG. 3C is a simplified cross-sectional view of installed solar modules and pan structures along BB line in FIG. 1 in a partial disassembled state according to an alternative embodiment of the present invention.

FIG. 3C is a simplified cross-sectional view of installed solar modules and pan structures along BB line in FIG. 1 in a partially disassembled state according to an alternative embodiment of the present invention. This diagram is merely an example and should not unduly limit the claims herein. One skilled in the art would recognize other variations, modifications, and alternatives. As shown, the rail structure 320 in FIG. 3A is replaced by several individual stanchions 350 for supporting at least four corner regions of the frame structure of the solar module 151 or 152 with a pan structure 335 or 336 inserted under each solar module. The stanchions can be directly mounted on the underlayment material 320 and each has a top surface region as a contact region for a portion of a first ledge of the pan structure. In this specific implementation of the present invention, the pan structure 335 or 336 may need to be mechanically strengthened by adding one or more crossing bars or fins as a major portion of the pan structure is not directly supported. Additionally, first ledge portion of each pan structure and the overlapping portion with another first ledge of a neighboring pan structure replace the continuous rail structures as a conductive busbar for coupling all solar module frames. Within the contact region, the contact elements 340 (see FIG. 3B) preformed in the first ledge of the pan structure still are applied to engage both the frame structure of the solar module and the top surface region of the standon. The sharp tips of the contact elements 340 are applied with force (or by weight of the solar module) to penetrate a coating/paint on the surfaces of the frame structures, leading to an excellent electric bonding between the module frame structure and the pan structure made by sheet metal material. For a sloped roof, the stanchions 350 can be equal sized to support the pan structures and installed solar modules on the underlayment material 320 of the sloped roof. In an alternative embodiment, for a flat roof, the stanchions 321 can be selectively made from one with small height to one with higher and higher height so that the pan structures and the installed solar modules are in a properly sloped configuration desired for solar application. Of course, there are many variations, alternatives, and modifications.

Figure 4:
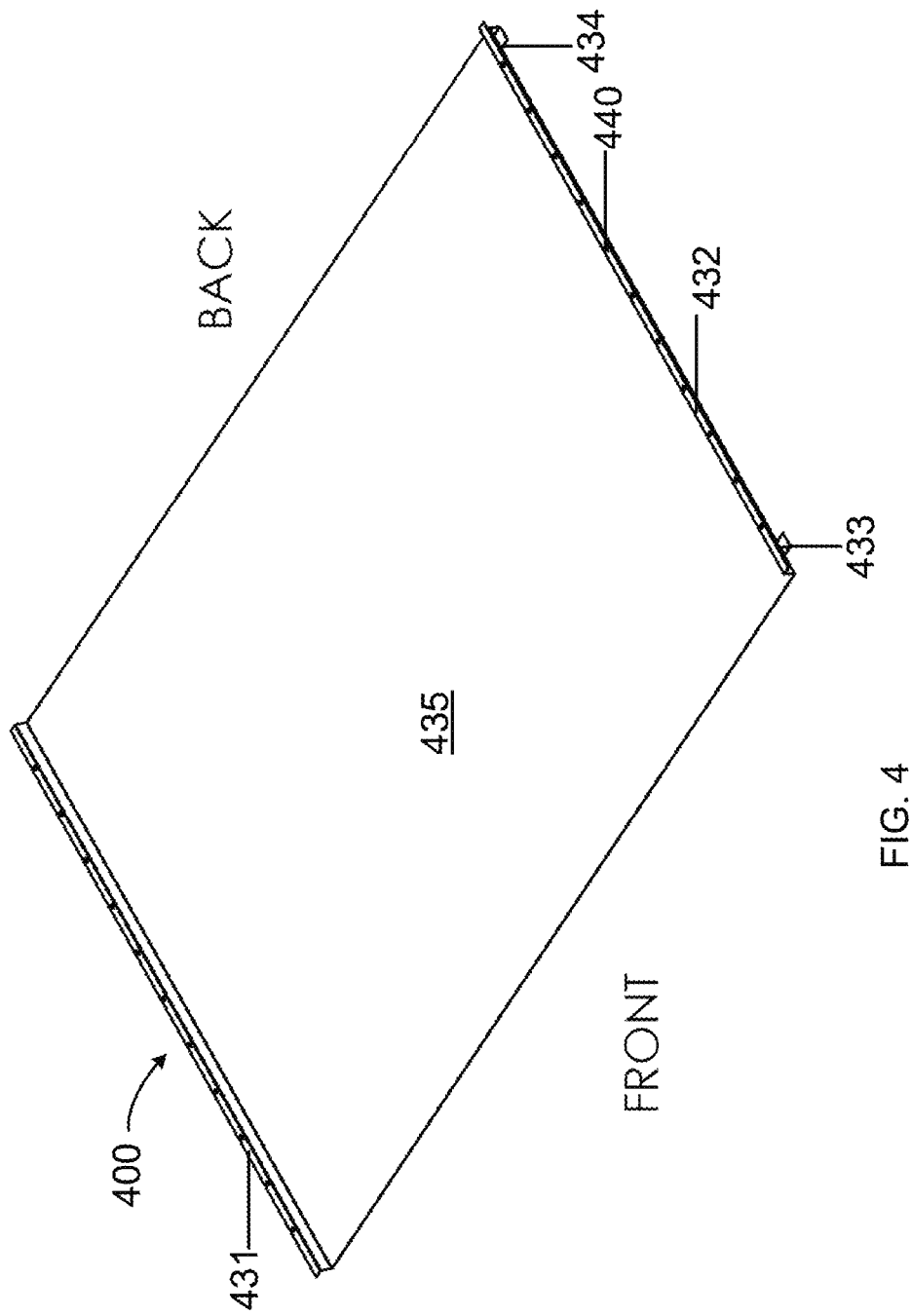
FIG. 4 is a perspective view of an exemplary pan structure according to an embodiment of the present invention.

FIG. 4 is a perspective view of an exemplary pan structure according to an embodiment of the present invention. This diagram is merely an example and should not unduly limit the claims herein. One skilled in the art would recognize other variations, modifications, and alternatives. In a specific embodiment, a pan structure 400 as shown includes a plate member 435 with four edges. In an example, the pan structure is made by a sheet metal. In another example, the pan structure is made by a galvanized steel sheet with casted edges. Two edge members 431 and 432 are configured to be a Γ-shaped structure respectively coupled to two opposite side edges of the plate member 435. The Γ-shaped edge member includes a first ledge and a second ledge coupled with an angle. The first ledge is used for mounting on the rail structure (see FIGS. 1, 2A, and 2B) and the second ledge keeps the plate member a distance lower than the first ledge. Within the first ledge multiple small structures 440 are pre-formed through its length with some separations. As seen in FIG. 3B, these small structures 440 includes upward or downward sharp tips formed alternatively along the ledge for bonding any objects placed above or below the first ledge. In another specific embodiment, the front and back side edges 433 and 434 may be configured to have one or more shaped structures coupled to a bottom face of the plate member 435. Of course, there can be many variations, alternatives, and modifications.

Figure 5:
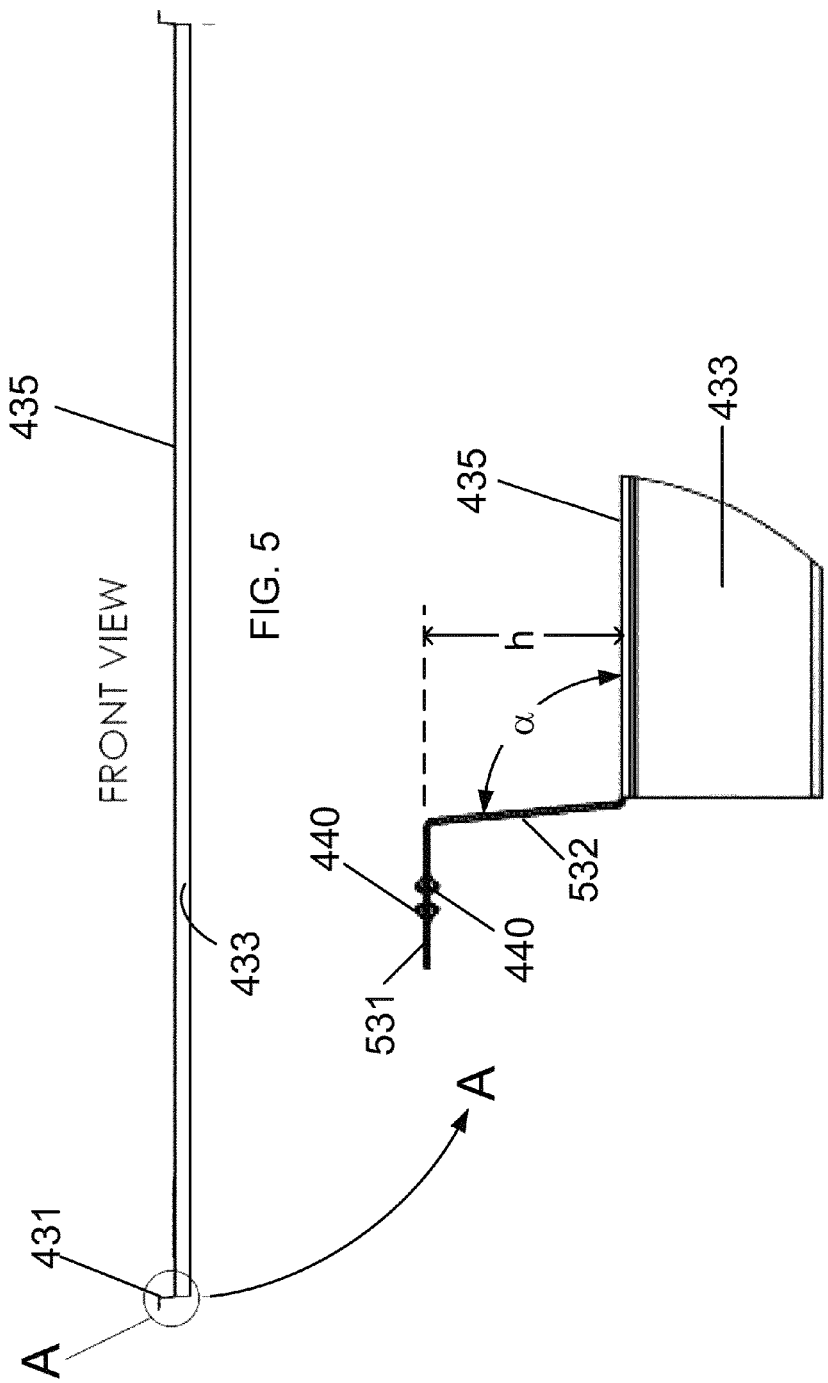
FIG. 5 is a front view of the pan structure in FIG. 4 according to the embodiment of the present invention.

FIG. 5 is a front view of the pan structure in FIG. 4 according to the embodiment of the present invention. In a specific embodiment, the pan structure includes a plate member 435 connected upwardly to an edge member 431 on the left side region A (and another edge member on the right side region) and connected downwardly to a front edge member 433. FIG. 5A is a detailed side view of a marked end region A in FIG. 5 according to the embodiment of the present invention. As shown, the edge member 431 is made by a first ledge 531 and a second ledge 532 connecting with the plate member 435. The first ledge 531 is substantially in parallel with the plate member 435 (although this should not be limited) and the second ledge 532 connects the first ledge and the plate member 435 with an angle α keeping the plate member 435 a distance h below the first ledge 531. Also shown, the first ledge 531, which is designated for mounting on the rail structure, includes one or more contact elements 440. In this side view, the one or more contact elements 440 are overlapped with some including upward tips and some including downward tips.

Figure 6:
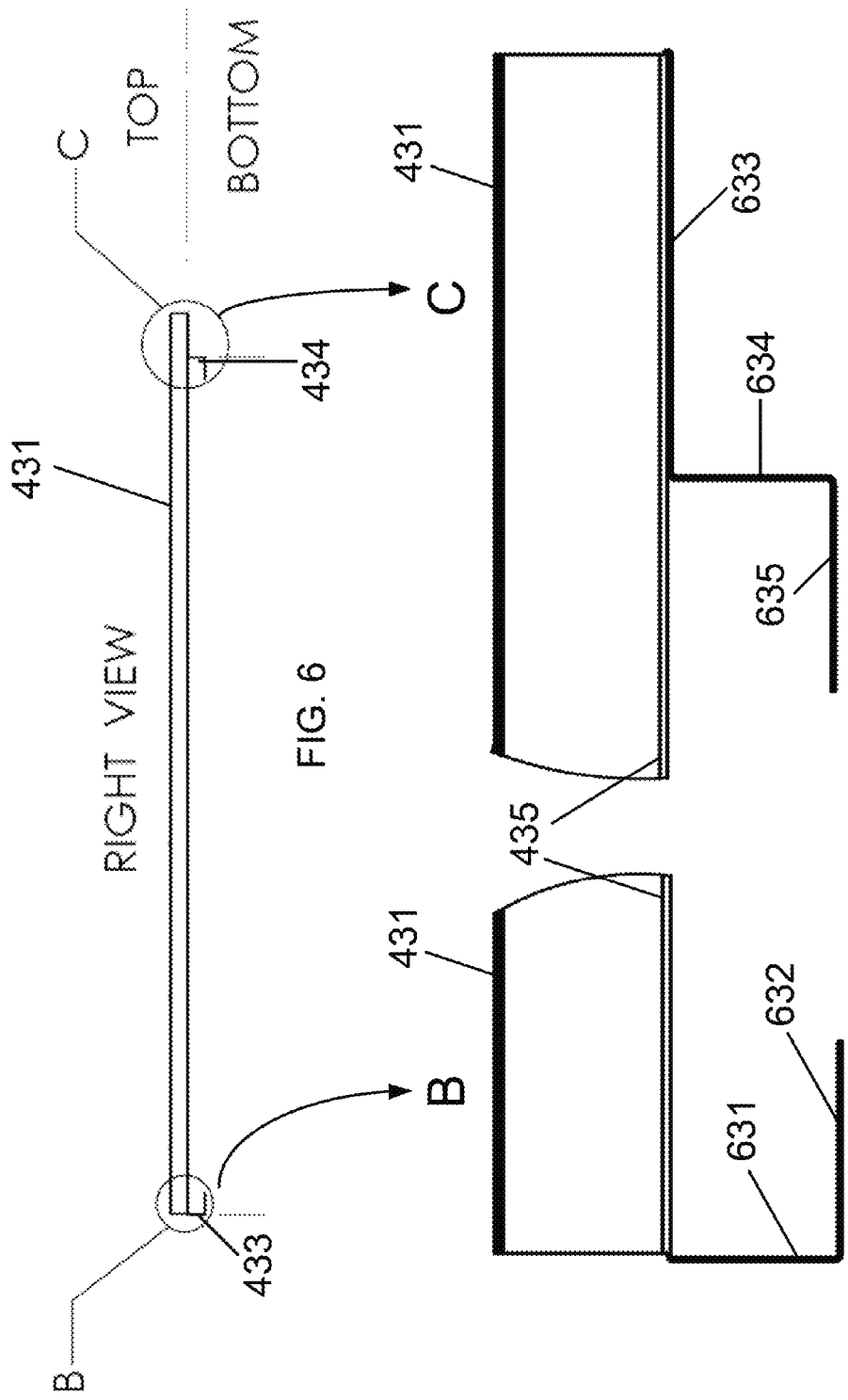
FIG. 6 is a right side view of the pan structure in FIG. 4 according to the embodiment of the present invention.

FIG. 6 is a right side view of the pan structure in FIG. 4 according to the embodiment of the present invention. Edge member 431 is coupled to the front edge member 433 on it first end region B and the back edge member 434 on the second end region C. An enlarged view of the first end region B is shown in FIG. 6A. As shown, the front edge member 433 is made of two ledges 631 and 632. The ledge 631 coupled to the bottom face of the plate member 435 and downwardly to the ledge 632 which is substantially flat, although the structural details are not limited. Another enlarged view of the second end region C is shown in FIG. 6B. The back edge member 434 includes three ledges 633, 634, and 635. The ledges 634 and 635 are substantially similar to the ledges 631 and 632 in structural configuration except in opposite direction. The ledge 633 is attached to the bottom face of the plate member 435 for making location of the ledges 634 retreated some distance from the very end of the second end region C. In an embodiment, this pan structure is configured to install one after another on the long rail structures, usually starting from a lowest end region of the rail structures (see FIG. 1). The back end edge of one pan structure is supposed to join the front end edge of another pan structure. The retreated distance at the second end region allows a second pan structure to have an overlapped region at the first end region of a previously loaded first pan structure. The second pan structure usually located at relative higher position than the first pan structure so that the overlapped region help to drain rain water downward properly. In another specific embodiment, the ledges 631 and 634 are substantially similar in size allowing an extended space between the bottom face of the plate member 435 and the ledges 632 and 635. This extended space can be used to hold an insulation material inserted from left (or right) end edge. The insulation material can provide additional protection (over the pan structure itself) of the roof material from any fire or other hazards coming from solar modules mounted above or any external hazards above those modules. Of course, there can be other variations, alternatives, and modifications.

Figure 7:
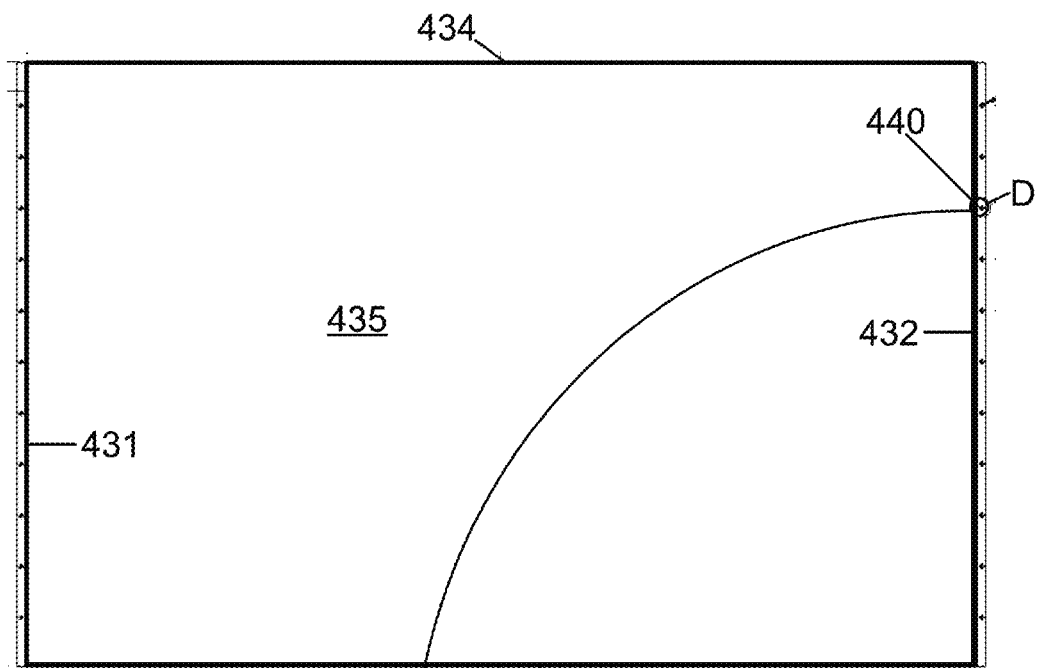
FIG. 7 is a top view of the pan structure in FIG. 4 according to the embodiment of the present invention.
Figure 7A:
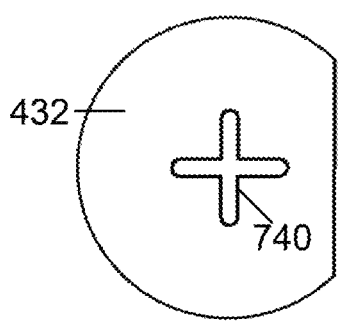
FIG. 7A is a detailed top view of a cross pattern in a marked region of FIG. 7 according to the embodiment of the present invention.
Figure 7B:
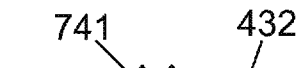
FIGS. 7B and 7C are respective side views of sharp tips pointed up and down as contact elements formed by punching upward and downward through the cross pattern in FIG. 7A according to the embodiment of the present invention.
Figure 7C:
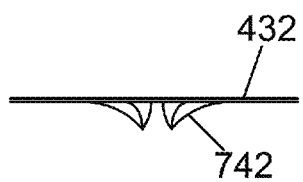

FIG. 7 is a top view of the pan structure in FIG. 4 according to the embodiment of the present invention. As shown, the region D with one of multiple contact elements 440 on the side edge member 432 is marked as a circle. FIG. 7A is a detailed top view of the marked region D of FIG. 7 according to the embodiment of the present invention. As shown, the contact element has a cross-star pattern 740 that is a throughhole formed in the edge member 432. In an example, the edge member is made by an aluminized zinc coated sheet metal. The cross-star pattern 740 is formed first with flat faces both on top and bottom of the edge member. Then a tool is applied in last step of the manufacture of the pan structure to punch through the cross-star pattern from either top to bottom or bottom to top. As shown in FIGS. 7B and 7C, after the tool punching step, several upward-pointed tips 741 or downward-pointed tips 742 are formed depending on the punching direction. Within the plurality of contact elements having the cross-star pattern, part of them are punched upward and part of them are punched downward. In an embodiment, the upward-pointed tips and downward-pointed tips are formed alternatively along the length of the edge member. As the pan structure is inserted between the one or more solar modules and the mounting rail structures, the upward-pointed tips and the downward-pointed tips are used to respectively form solid contact with metal frames of the solar modules and the rail structures, as seen in FIG. 1 and FIG. 3B. Of course, this is shown as merely an example, the contact member 440 can have various other shaped patterns, so do the corresponding upward or downward tips formed thereafter. The advantage of these bonding elements lie in easy manufacturability, low cost, multiplicity for forming contacts with enhance security. When applying these pan structures in the process of solar module installation, the bonding feature of the pan structures can be seamlessly implemented with the system while the pan structures execute their multiple other functions. One or more other functions of the pan structures can be found in the references provided earlier and specifically in the specification below.

The pan structures, in one or more examples described above, are used their edge members for creating contact bonding between the solar modules and mounting rail structures when installing the solar modules to a target location (for example, a roof of a building). The pan structures, in another example described earlier, are used their plate members as fire barriers to protect the underlayment materials at the target location. Furthermore, in one or more embodiments of the present invention, the pan structures that installed one after another with the one or more solar modules on the mounting rail structures are also configured to form a plenum structure (as seen in FIG. 1 and FIG. 3A). An airflow can be drawn from ambient into the plenum structure (see FIG. 1) defined between the plate member of the pan structures and bottom face of the solar modules in their mounting positions. The airflow can be heated by the thermal energy generated by the solar modules and naturally flows upward (see FIG. 3A) along the plenum structure formed on the sloped roof (or sloped mounting rail structures). The airflow thus is able to carry the thermal energy at least partially from the solar modules and be utilized as a medium by various home utility systems.

FIGS. 8A-8F are perspective views of various shaped structure elements formed on a plate member of a pan structure according to specific embodiments of the present invention. These diagrams are merely examples and should not unduly limit the claims herein. One skilled in the art would recognize other variations, modifications, and alternatives. In one or more embodiments, the airflow in the plenum structure can be modified to enhance the heat transfer process between the air and the heated bottom face of the solar modules. In an example, the pan structure includes one or more structural elements on the plate member to serve as air turbulators to induce turbulence in the airflow through the plate member.

Figure 8A:
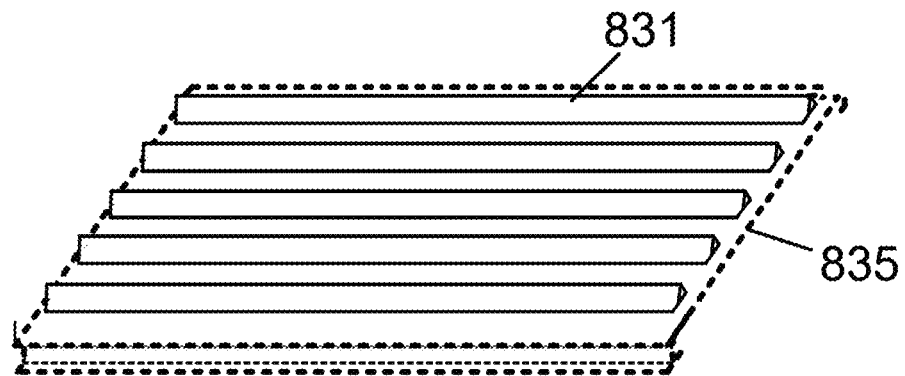
FIGS. 8A-8F are perspective views of various shaped structure elements formed on a plate member of a pan structure according to specific embodiments of the present invention.

The turbulence accelerates local flow speed and enhance heat transfer rate. FIGS. 8A-8E shows various examples of shaped turbulators formed on the plate member of the pan structure. For example, FIG. 8A shows one or more triangular ridges 831 formed across the lateral dimension of the plate member 835. The height of the ridges should be within the allowed space determined by the distance h provided by the edge members of the pan structure (see FIGS. 2A and 2B) at least for frameless solar module (for framed modules, the space could be larger due to the extra height of the frame).

Figure 8B:
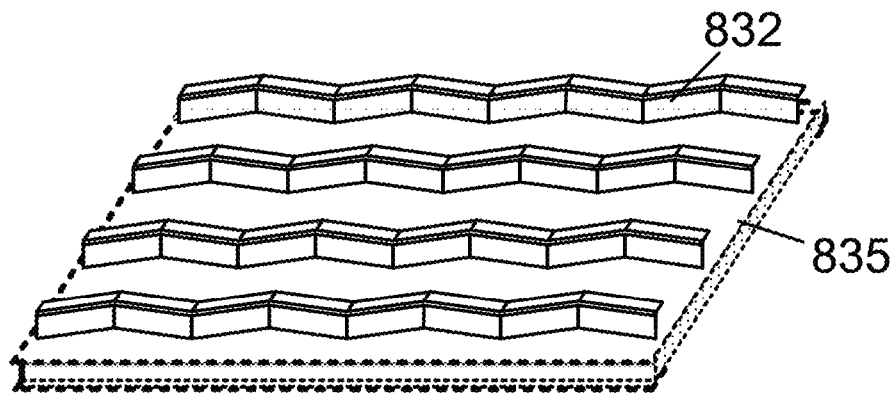
Figure 8C:
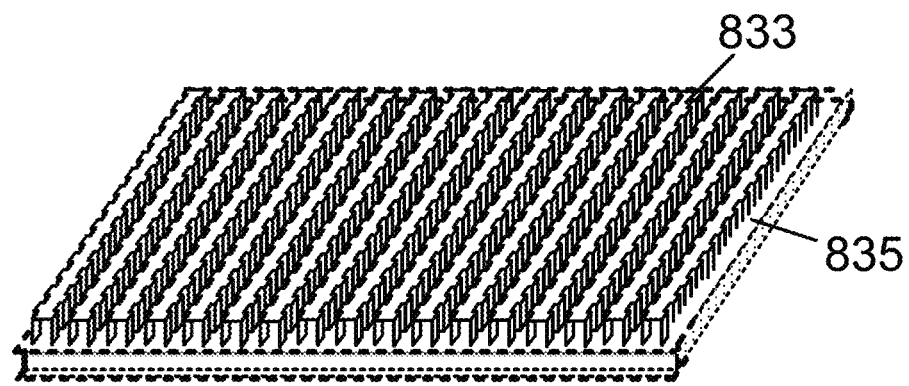

FIG. 8B shows one or more bended fin structures 832 zigzagged formed on the plate member 835. FIG. 8C, in another example, shows a network of comb structures 833 mainly aligned the flow direction with the height confined between the plate member 835 and the bottom face of the installed solar modules.

Figure 8D:
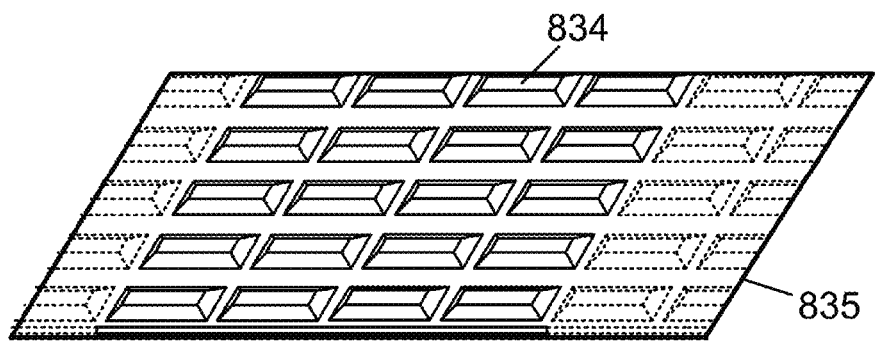
Figure 8E:
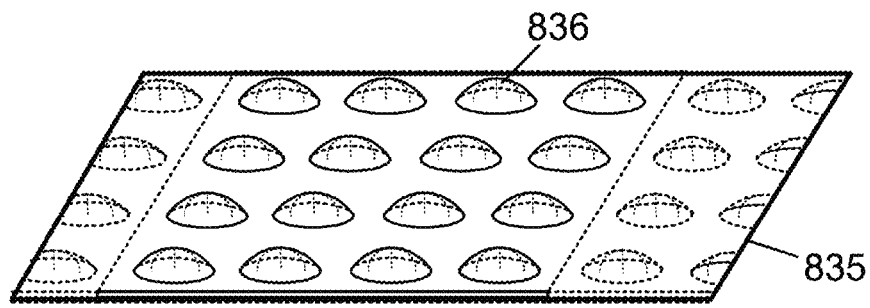

FIGS. 8D and 8E further show examples of a plurality of protrusions 834 and 836 with different shapes formed on the plate member 835. These structure elements can also be arranged in different orientations depending on embodiments to induce different turbulence effect to the airflow flowing in the plenum structure. Of course, there can be many other variations, alternatives, and modifications. For example, alternatively, those structure elements are utilized for strengthening the pan structure to prevent deformation.

Figure 8F:
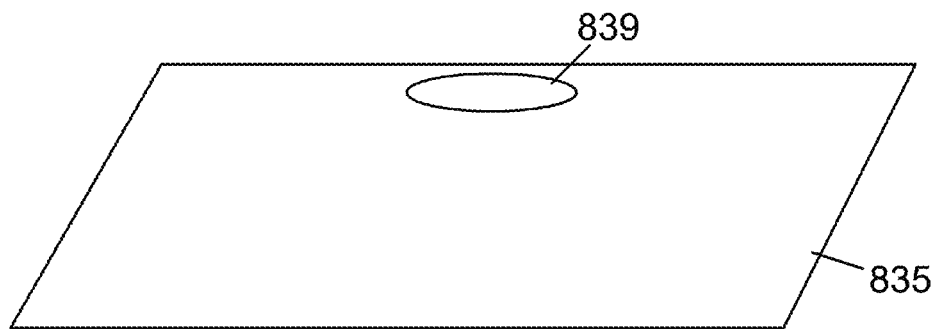

FIG. 8F shows an air outlet formed near the back edge of the pan structure according to a specific embodiment of the present invention. As mentioned before, multiple pan structures are loaded one by one orderly along the mounting rail structure from low end to high end. This pan structure having the air outlet 839 in its plate member 835 is the last pan structure along the same rail structure. In an embodiment, the air outlet 839 includes a through hole configured to couple with an air duct that can guide the airflow out of the plenum structure for various thermal applications. For example, the air duct can be built to pass through the roof deck into the home, or to firstly pass through an energy transfer module for processing the airflow and utilize the thermal energy it carries. In a certain embodiment, the air outlet can be formed on an end plate associated with the highest end region of the rail structures. In certain other embodiments, the air outlet can include multiple through-holes with different sizes and shapes to couple with different ducts led to different destinations. Of course, one skilled in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims. Further details of a method for bonding one or more solar modules installed on a target location for providing common electric grounding and fulfill other functionalities of the mounting structures to utilize solar energy in many ways, can be found throughout the present specification and more particularly below.

Figure 9:
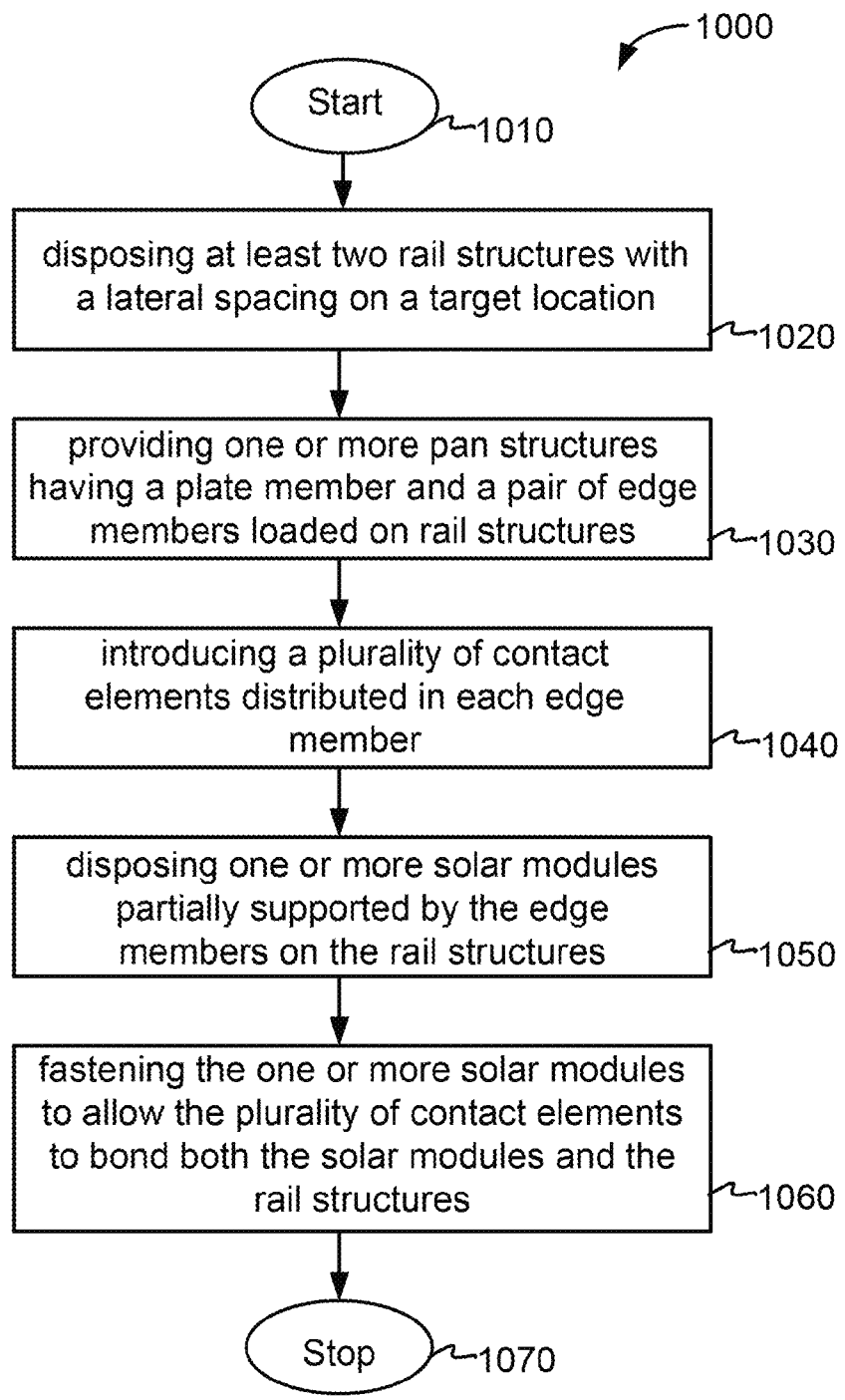
FIG. 9 is a flow chart illustrating a solar module bonding method integrated into a pan structure according to an embodiment of the present invention.

FIG. 9 is a simplified flow diagram illustrating a method for providing electric bonding for multiple solar modules on mounting rail structures according to a specific embodiment of the present invention. This diagram is merely an example, which should not unduly limit the scope of the claims herein. One of ordinary skill in the art would recognize other variations, modifications, and alternatives. It is also understood that the example and embodiments described herein are for illustrative purposes only and that various modifications or changes in light thereof will be suggested to persons skilled in the art and are to be included within the spirit and purview of this process and scope of the appended claims.

As shown in FIG. 9, the present method can be briefly outlined below.
1. Start;
2. Dispose at least two rail structures with a lateral spacing on a target location;
3. Provide one or more pan structures having a plate member and a pair of edge members loaded on rail structures;
4. Introduce a plurality of contact elements distributed in each edge member;
5. Dispose one or more solar modules partially supported by the edge members on the rail structures;
6. Fasten the one or more solar modules on rail structures to allow the plurality of contact elements to bond both the solar modules and the rail structures; and
7. Stop.

These steps are merely examples and should not unduly limit the scope of the claims herein. As shown, the above method provides a way of bonding one or more solar modules by integrating one or more pan structures between the solar modules and mounting rail structures according to an embodiment of the present invention. In a preferred embodiment, the method uses a pan structure having at least a pair of edge members configured to be sandwiched between two rail structures and installed solar modules to form electric bonding between them via a plurality of contact elements. One of ordinary skill in the art would recognize many other variations, modifications, and alternatives. For example, various steps outlined above may be added, removed, modified, rearranged, repeated, and/or overlapped, as contemplated within the scope of the invention.

As shown in FIG. 9, the method 1000 begins at start, step 1010. In a specific embodiment, the present method provides a solar module bonding method integrated into a pan structure along with the installation of one or more solar modules on a target location (see FIG. 1). Here, the method begins at a selected target location, a roof of a building, on which one or more solar modules are to be installed for solar energy collection. The roof may be sloped for typical home while can be flat. Depending on specific roof, a corresponding mounting rail system is introduced, either being installed directly on roof deck via struts or on a pre-determined sloped rack for providing a base structure for module installation at the target location.

In step 1020, the method 1000 includes disposing at least two rail structures with a lateral spacing on the base structure at the target location. In a specific embodiment, the two rail structures are in parallel and aligned with the slope direction of the roof or the rack. At least one of the mounting rail structures can be used for mounting solar modules from both sides. For example in FIG. 1, rail structure 112 is capable of mounting the module 150 on its left and also mounting module 152 on its right (of course, another rail structure is needed for support the right end of the module 152). The lateral spacing between the two rail structures is a standard determined by the frame size of the solar modules (or directly the module size). The rail structure also is configured to have a predetermined height which can be utilized for inserting pan structure and other structure elements.

The method 1000 further includes a step 1030 of providing one or more pan structures having a plate member and a pair of edge members loaded on rail structures. In a preferred embodiment, the pan structure is configured to match the standard lateral spacing and fit a specific rail mounting fixture geometry. For example, the plate member is a sheet metal having a lateral dimension slightly smaller than the above standard lateral spacing of the rail structure so that it can be fitted into the space provided therein. The pair of edge members is configured to have a supporting portion that can fit with the specific rail fixture and another extension portion to couple with the plate member for providing additional structural functionalities. For example, the plate member is intentionally set to be lower than the edge supporting portion to provide an extra spacing or air gap between the plate member and bottom face of the module (may include frame height of the modules). Other structure elements can be added to the plate members for other applications of the pan structure. For example, the front and back edges can also be configured to hold additional inserts associated with the pan structure or structurally matched for linking with a neighboring pan structure (see FIGS. 4, 5, 5A, 6, 6A, and 6B). In an alternative embodiment, multiple pan structures are loaded one by one along the rail structures, starting from a lowest end region of the rail structure and every additional pan structure being placed with a portion of front edge region over a portion of back edge region of the previously loaded pan structure. In particular, the first pan structure disposed at the lowest position has a coupling mechanism associated with a end plate (see FIG. 1) and the last pan structure disposed at the highest position is optionally to include an air outlet within its plate member for forming an exit port for a plenum structure formed between all the pan structure and one or more installed solar modules.

Referring to FIG. 9, the method 1000 also includes a step 1140 for introducing a plurality of contact elements distributed in each edge member. In a preferred embodiment, the plurality of contact elements is formed on the supporting portion of each edge member. The supporting portion itself is configured to be supported by the mounting rail structure and further to provide support for the installed solar module. For example, a portion of the frame structure of the solar module is placed on top of the edge supporting portion (see FIG. 2A). The contact elements are configured to form bonding between the edge supporting portion and the frame structure of the module or between the edge supporting portion and the mounting rail structure. In a specific embodiment, the contact element includes one or more sharp upward tips and one or more sharp downward tips, facilitating a formation of firm contact via mere mechanical engagement.

The method 1000 further includes a step 1150 of disposing one or more solar modules partially supported by the edge members on the rail structures according to an embodiment of the present invention. In particular, for a solar module with a pre-framed assembly, the frame structure is at least partially engaged with the edge supporting portion that has been disposed onto the rail structure. In certain embodiment, the frameless module can also be disposed with a proper tedlar structure attached to its bottom face. In an alternative embodiment, multiple solar modules are disposed one after another from the lower position to higher position along the sloped mounting rail structures. Between neighboring modules, a T-cover can be placed with adhesion to seal the joint. For framed modules, the frame structure can be configured to include a joint section and sealing mechanism for making the module-to-module link. Of course, there can be many variations, modifications, and alternatives.

The method 1000 additionally includes a step 1060 to fasten the one or more solar modules to allow the plurality of contact elements bonding both the solar modules and the rail structures according to one or more embodiments of the present invention. In a specific embodiment, a fastener or top rail is placed and screwed down so that the solar module or its frame structure is forcedly pressed on the edge supporting portion and further on the rail structure below. The contact elements include pre-formed sharp tips that are pointed either upward or downward alternatively (see FIGS. 3B, 7B, and 7C). The fastening force would cause the sharp tips to partially penetrate into the frame structure above or the rail structure below. The pan structure is made of galvanized sheet metal and the sharp tips are formed by punching a specific tool through a pre-patterned star-shaped hole. Upward or downward pointed tips are determined by tool punching direction. In one or more embodiments, the frame structure of the solar module typically is made by anodized aluminum, the sharp tips of the contact elements can penetrate a sufficient depth to break the insulation layer and form a solid electric bonding between the module frame and the pan structure. Similarly, the downward-pointed sharp tips of the contact elements are pressed to form good electric bonding between the pan structure and supporting face of the rail structure which is usually made by aluminum material (having a thin oxide layer). Therefore, a complete path is formed from each frame of the installed solar modules and each mounting rail structures. The rail structure, assuming a metal material, then acts as a busbar conductor for connect all the solar modules to a common electric grounding base. In case that the rail structure is replaced by certain insulating material such as plastic material, the mutually connected pan structure can still serve as a connector to the common electric ground base for the solar module system. The bonding method ends with the step 1170. Of course there can be other variations, modifications, and alternatives.

The above sequence of processes provides a solar module bonding method integrated into a pan structure inserted during the solar system installation according to an embodiment of the present invention. As shown, the method uses a combination of steps including designing a proper pan structure associated with specific mounting rail structures designated for installing one or more solar modules on a target location. Other alternatives can also be provided where steps are added, one or more steps are removed, or one or more steps are provided in a different sequence without departing from the scope of the claims herein. For example, some steps can be added to modify the pan structure for enhancing its function for decoupling the solar module with the underlayment material, or serving as a fire barrier between the installed solar module and the roof underlayment material and roof deck. In another example, some steps are added to modify the plate member structure for creating a plenum structure designated to draw an airflow through the bottom face of the installed solar modules. In yet another example, some steps are inserted to add structure elements on the plate members of the pan structures for inducing air turbulence for the airflow in the plenum structure so that the heat transfer from the heated solar module to the air becomes more efficient. In yet still another example, additional step includes configuring the pan structures so that the last pan structure has an air outlet for guiding the airflow out of the plenum structure for additional thermal applications. Examples about implementing the present method and one or more additional steps mentioned above can be found throughout the present specification.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A pan structure for bonding solar modules installed on a target position, the pan structure comprising:

a plate member having a length and a width, the plate member being configured to have the width to fit a spacing between two rail structures;

a pair of edge members configured to respectively attach to two length sides of the plate member, each of the pair of edge members having a first ledge and a second ledge, the first ledge being electrically conductive and having a bottom side being supported by one of the two rail structures and a top side for supporting at least a frame edge region of a solar module, the second ledge connecting the first ledge to the length side of the plate member to provide a distance between the bottom side of the first ledge and the plate member; and a plurality of contact elements spatially distributed along the first ledge, each contact element comprising one or more protrusions on both the top side and the bottom side of the first ledge for generating a bonding force between the frame edge region of the solar module mounted on the first ledge and the rail structures.

2. The pan structure of claim 1 wherein the solar module comprises a solar panel selected from photovoltaic devices, solar thermal devices, and a combination of both photovoltaic devices and solar thermal devices, the solar panel being packaged in a metal frame.

3. The pan structure of claim 1 wherein the first ledge comprises a sheet metal coated with an aluminized-zinc coating.

4. The pan structure of claim 1 wherein the distance between the bottom side of the first ledge and the plate member provides a plenum between the plate member and the solar module mounted on the first ledge for drawing airflow along the length direction through the plate member.

5. The pan structure of claim 4 wherein the plate member comprises one or more structure elements selected from a flat surface, a plurality of roughened textures, one or more ridges across the plate member, a plurality of shaped protrusions, for inducing a turbulence to the airflow within the plenum.

6. The pan structure of claim 4 wherein the plate member comprises an optional exit region for connecting an air duct for guiding the airflow out of the plenum.

7. The pan structure of claim 1 wherein the one or more protrusions comprises hard tips configured to penetrate an insulation layer and/or coating overlying the frame edge region and the rail structure to form a conductive path between the solar module and the rail structure.

8. A solar module bonding method integrated into a pan structure, the method comprising:

disposing at least two rail structures with a lateral spacing on a target location;

installing a pan structure comprising a plate member and a pair of edge members, the pair of edge members being configured to respectively couple the two rail structures with the plate member across the lateral spacing;

introducing a plurality of contact elements distributed in each of the pair of edge members at alternative locations, each contact element comprising upward-pointed tips and downward-pointed tips;

disposing a solar module packaged in a frame structure so that the pair of edge members is sandwiched between the frame structure and the two rail structures;

fastening the solar module on the two rail structures so that the upward-pointed tips are compressed partially into the frame structure of the solar module and downward-pointed tips are compressed partially into the rail structure;

whereupon the plurality of contact elements in each of the pair of edge members form electrical grounding pathways for the solar module without extra wiring, and the plate member automatically forms a barrier of thermal insulation and fire retardation for the target location.

9. The method of claim 8 wherein the rail structure is made by metal material to serve as a busbar conductor connecting a common grounding base at the target location for multiple solar modules installed thereon.

10. The method of claim 8 wherein each of the pair of edge members comprises a first ledge member configured to be supported by one of the two rail structures and a second ledge member connected the first ledge member to the plate member to keep the plate member a distance below the first ledge member.

11. The method of claim 10 wherein the introducing a plurality of contact elements comprises punching through the first ledge member at one or more locations from bottom to top to create the upward-pointed tips and punching through the first ledge member at alternative one or more locations from top to bottom to create the downward-pointed tips.

12. The method of claim 8 further comprising installing multiple pan structures along a length direction of the two rail structures, each additional pan structure being disposed at an upper position over a previously installed pan structure with partially overlapped portions for corresponding edge members and plate members to provide an extended plate member across the lateral spacing along the length direction of the two rail structures.

13. The method of claim 12 wherein installing multiple pan structures along a length direction of the two rail structures further comprises:

providing contact elements via the edge members of the multiple pan structures for bonding with multiple solar modules;

decoupling the multiple solar modules from an underlayment material by the extended plate member for insulation and fire retardation; and forming a plenum structure extended along the length of the two rail structures between the multiple solar modules and the extended plate member for drawing airflow therethrough from ambient.

14. The method of claim 13 wherein the each pan structure comprises one or more native or manufactured elements selected from a flat surface, a plurality of roughened textures, one or more ridges across the plate member, a plurality of shaped protrusions for causing turbulence to the airflow through the plenum structure.

15. The method of claim 13 wherein the bonding with multiple solar modules comprises:

using the upward-pointed tips to penetrate any insulating layer on the frame structure to form conductive paths between the multiple solar modules and the multiple pan structures;

using the downward-pointed tips to form electric conductive paths between the multiple pan structures and the rail structures; and forming a complete conductive path through the rail structures and the multiple pan structures for grounding of the multiple solar modules.

16. The method of claim 8 wherein the pan structure comprises a fixture at bottom of the plate member configured to hold a foam material for enhancing fire retardation and thermal insulation for the underlayment material of the target location.

17. A pan structure for bonding solar modules supported at least by four stanchions on a target position, the pan structure comprising:

a plate member substantially matching a dimension of a solar module;

a pair of edge members configured to couple the plate member with the at least four stanchions, each of the pair of edge members having a first ledge member being electrically coupled with two of the four stanchions and a second ledge member connecting the first ledge member to a length side of the plate member with an angled configuration so that the plate member is located a distance below the first ledge member; and one or more contact elements at least distributed along first ledge member for bonding the solar module for electrical grounding;

whereupon the plate member is configured to be a fire barrier for isolating the solar module from the target position and a base plane of a plenum structure within the distance provided between the solar module and the plate member.

18. The pan structure of claim 17 wherein the plate member is configured to attach an insulation material for reducing thermal radiation transfer between the solar module and the target position.

19. The pan structure of claim 17 wherein the plate member is a sheet metal material with an aluminized-zinc coating, configured to be a fire barrier by itself and capable of attaching a fire retardant material.

20. The pan structure of claim 17 wherein the one or more contact elements comprise sharp tips pointed out of the first ledge member, forming a compression mechanism for generating a force to penetrate any coating material overlying the solar module for forming an electrically conductive path.

* * * * *